United States Patent [19]
Fujita et al.

[11] Patent Number: 5,394,149
[45] Date of Patent: Feb. 28, 1995

[54] METHOD OF ABSORBING ELECTROMAGNETIC WAVES

[75] Inventors: Junichi Fujita, Yamatokouriyama; Hiroyuki Okazaki, Daito; Mitsuo Kiura, Yamatotakada; Yoshiaki Yoshida, Ikoma, all of Japan

[73] Assignee: Osaka Gas Company Limited, Osaka, Japan

[21] Appl. No.: 965,265

[22] PCT Filed: Nov. 12, 1991

[86] PCT No.: PCT/JP91/01544
§ 371 Date: Jan. 26, 1993
§ 102(e) Date: Jan. 26, 1993

[87] PCT Pub. No.: WO92/22193
PCT Pub. Date: Dec. 10, 1992

[30] Foreign Application Priority Data
May 28, 1991 [JP] Japan ................... 3-153984

[51] Int. Cl.$^6$ .............................................. H01Q 17/00
[52] U.S. Cl. ................................................. 342/1
[58] Field of Search ................................. 342/1-4

[56] References Cited
FOREIGN PATENT DOCUMENTS
108603 of 1983 Japan .
58-108602 6/1983 Japan .
39240 of 1989 Japan .
56559 of 1989 Japan .

Primary Examiner—Mark Hellner
Attorney, Agent, or Firm—Larson & Taylor

[57] ABSTRACT

In accordance with the method of the invention, the electromagnetic wave is absorbed by disposing an oriented carbon fiber-containing composition in such a manner that the longitudinal axis of its carbon fiber is aligned with the direction of the electric field of the wave W to be absorbed.

3 Claims, 9 Drawing Sheets

METHOD OF ABSORBING ELECTROMAGNETIC WAVES

FIELD OF THE INVENTION

The present invention relates to a method of absorbing electromagnetic waves such as TV and radio waves using a carbon fiber-containing composition as a wave absorber.

BACKGROUND OF THE INVENTION

It is known that a variety of structures such as skyscrapers, power-transmission towers, bridges, rapid transit railroads, speedways, golf practice range facility, etc. as well as aircraft may shield and reflect TV, radio and other waves to cause ghosts in an expansive area.

For the purpose of preventing such ghosts, it was proposed to use wave absorbers molded from a concrete, e.g. orthodox concrete, mortar, lightweight concrete, etc., containing carbon fibers as described inter alia, in Japanese Unexamined Patent Publication Nos. 108603/1983 and 108602/1983.

However, the wave-absorbing efficiency of the conventional wave absorber can be improved only by increasing the proportion of carbon fiber or increasing the thickness of the absorber.

The complex relative dielectric constant $\epsilon$ of a dielectric material is given by:

$$\epsilon = \epsilon' - j\epsilon''$$

wherein the real part $\epsilon'$ represents a dielectric constant and the imaginary part $\epsilon''$ represents a loss factor.

Figure 3:
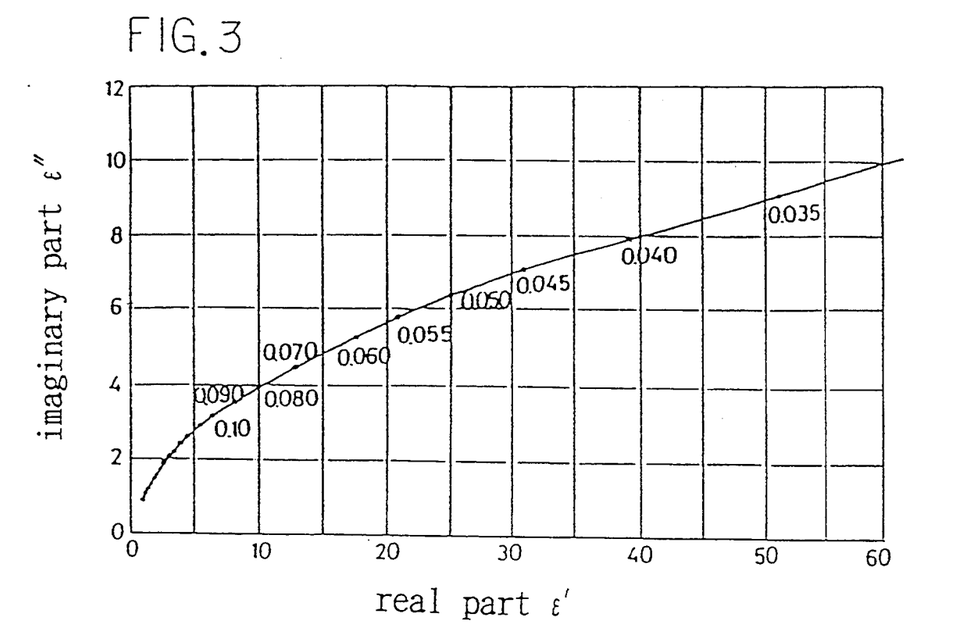
FIG. 3 is a characteristic curve obtained in the absence of reflection.

It is also known that when the real part $\epsilon'$ and imaginary part $\epsilon''$ values are plotted on the abscissa and the ordinate, respectively, a characteristic curve of $D(=d/\lambda_0)$, where d is the thickness of a sample and $\lambda_0$ is the wavelength of the electromagnetic wave incident on the sample, can be constructed in the absence of reflection as shown in FIG. 3. The figures given in FIG. 3 are values of D.

By way of illustration, assuming that the waves of TV Channel 2 in Japan (allocated frequency: 96-102 MHz, video carrier frequency 97.25 MHz, audio carrier frequency 101.75 MHz) are absorbed without reflection by a 10 cm-thick wall, the wavelength $\lambda_0$ of the longer wavelength video carrier wave is:

$$\lambda_0 = (3 \times 10^{10}) \div (97.25 \times 10^6) \approx 308.48 \text{ cm.}$$

Accordingly the value of D is:

$$D = 10 \div 308.48 = 0.032$$

The values of the real part $\epsilon'$ and imaginary part $\epsilon''$ which satisfy the above value of D is:

$$\epsilon' \approx 61$$

$$\epsilon'' \approx 10.$$

When the thickness of the sample is 5 cm, D=0.016. It is clear that a larger value is necessary for the real part $\epsilon'$.

However, in the conventional carbon fiber-containing wave absorber, it was difficult to realize such a large value for the real part $\epsilon'$. Thus, the conventional wave absorber was deficient in wave absorbing capacity.

The present invention has been accomplised under the circumstances described above. The object of the present invention is to provide a wave-absorbing method in which electromagnetic waves can be absorbed with high efficiency even using a carbon fiber-containing composition of reduced carbon fiber content and reduced thickness.

DISCLOSURE OF THE INVENTION

To accomplish the above-mentioned object, the present invention provides the wave-absorbing method characterized in that a carbon fiber-containing composition containing carbon fibers oriented in a specific direction is disposed in such a manner that the longitudinal axis of said carbon filaments is aligned with the direction of the electric field of an electromagnetic wave to be absorbed.

The disposition of a wave absorber with the longitudinal axis of carbon fibers aligned with the direction of the electric field of an electromagnetic wave means not only the disposition of the carbon fiber-containing composition with the longitudinal axis of its carbon fibers perfectly lined up with the direction of the electric field but also means the following disposition. That is, the disposition of the wave absorber satisfies the following conditions:

$$\epsilon' \geq \epsilon'min + (\epsilon'max - \epsilon'min) \times 0.5$$

and/or $$\epsilon'' \geq \epsilon''min + (\epsilon''max - \epsilon''min) \times 0.5,$$

wherein $\epsilon'$ and $\epsilon''$ represent the respective values of the real part and imaginary part of the complex relative dielectric constant of said carbon fiber-containing composition on which the wave to be absorbed is incident at a given angle, and $\epsilon'max$, $\epsilon'min$, $\epsilon''max$ and $\epsilon''min$ represent the maximum and minimum values of $\epsilon'$ respectively.

The degree of carbon fiber orientation is defined herein as $$A = \epsilon'max - \epsilon'min,$$

$$B = \epsilon''max - \epsilon''min.$$

Figure 4:
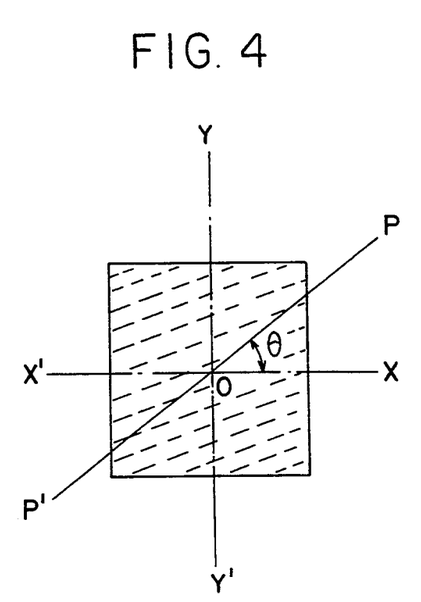
FIG. 4 is a side view for explaining the degree of orientation.

This matter is now described below in further detail. For, explaining the degree of orientation, FIG. 4 is a side view showing a sample of the carbon fiber-containing composition cut on an optional plane. Two lines passing through the center of the section and intersecting each other at right angles are designated as X—X' and Y—Y'. The angle between a cutting line P—P' passing through the center O and the reference line X—X' are designated as Θ. When the angle Θ are varied within the range of 0° to 180°, the maximum values of the real part $\epsilon'$ and imaginary part $\epsilon''$ of the complex relative dielectrie constant are taken as $\epsilon'max$ and $\epsilon''max$, respectively, and the minimum values of the corresponding parts of the complex relative dielectric constant are taken as $\epsilon'min$ and $\epsilon''min$, respectively. Then, ($\epsilon'max - \epsilon'min$) is defined as the degree of carbon fiber orientation A and ($\epsilon''max - \epsilon''min$) is defined as the degree of carbon fiber orientation B. (The values of $\epsilon'$ and $\epsilon''$ are measured by applying an electric field in parallel with the cutting line P—P').

Assuming that the orientation of carbon fiber is completely random, $\epsilon'max = \epsilon'min$ and $\epsilon''max = \epsilon''min$.

Here, A=0, B=0. The larger the values of A and B, the higher is the degree of orientation of carbon fiber in the composition. Where A<25 and/or B<5, the degree of carbon fiber orientation is low and, therefore, it is necessary to either incorporate more carbon fiber for increasing the carbon fiber content or increasing the thickness of the wave absorber.

The carbon fiber which can be used includes a variety of carbon fibers such as rayon type, poly acrylonitrile (PAN) type, phenolic resin type, coal pitch type, petroleum pitch type and other type carbon fibers. The carbon fiber generally has a filament diameter of about 2 to 30 μm and a filament length of about 0.1 to 10 mm. Where the matrix is mortar or concrete, it is preferable to employ carbon fibers with an average filament length of 0.2 to 0.8 m. In the case of resin matrices, the preferred length is about 0.2 to 5 mm.

The term "the length of carbon fiber" used throughout the specification and the appended claims does not mean the length of carbon fiber incorporated in the matrix at the manufacture of the carbon fiber-containing composition but means the length of carbon fiber as it exists in the molded composition. The larger the length of carbon fiber, the more satisfactory is the result but since the carbon fiber may be cut in the course of production of the carbon fiber-containing composition, particularly in the mixing step for a composition using mortar or concrete as the matrix, as well as from workability points of view, it is difficult to obtain a composition containing carbon fiber over 10 mm in length. On the other hand, when the length is less than 0.1 mm, the absolute values of the real part $\epsilon'$ and imaginary part $\epsilon''$ of the complex relative dielectric constant $\epsilon$ cannot be increased sufficiently (only up to $\epsilon'=10$ and $\epsilon''=1-2$, approx.) even if the carbon fiber content is increased.

As the matrix material for the wave absorber, there may be mentioned various hydraulic cement products such as mortars, which are mixtures of cement, fine aggregates and admixtures, concretes which are mixtures of such mortars with coarse aggregates, and such other materials as gypsums, epoxy and other resins, ceramics, rubbers and so on.

The carbon fiber content, based on the hydraulic component (e.g. cement) of the hydraulic composition (e.g. mortar), is preferably in the range of 0.5 to 10 percent by weight. If the proportion is less than 0.5 weight %, the conditions required for impedance matching with the electromagnetic wave can hardly be satisfied, while the use of carbon fiber in excess of 10 weight % makes it difficult to disperse the fiber uniformly into the matrix.

When a resin is used as the matrix, the preferred carbon fiber content is 5 to 25 weight % based on the resin. If the carbon fiber content is less than 5 weight %, impedance matching with the wave is difficult, while a carbon fiber content of more than 25 weight % makes it difficult to disperse the carbon filaments uniformly in the matrix.

According to the wave-absorbing system of the invention, the desired effect can be achieved irrespective of whether the electromagnetic wave is a horizontally polarized wave or a vertically polarized wave. Taking the horizontally polarized wave as an example, because the direction of the electric field generated thereby is horizontal, the exterior wall of the structure, as such, is made of the wave absorber or the wave absorber is affixed to the structure in such a manner that the longitudinal axis of oriented carbon fiber will be horizontal and intersecting the direction of advance of the electromagnetic wave. When this is done, the dielectric constant in the direction of the electric field of the wave is increased and the necessary impedance matching can be obtained at a low value of D in FIG. 3, with the result that the electromagnetic wave can be absorbed with an unprecedentedly thin wave absorbent.

BEST MODE EMBODIMENTS OF THE INVENTION

Embodiments of the invention are now described in detail.

First embodiment

Orthodox portland cement, silica sand No. 6 as fine aggregate, methylcellulose as an admixture, water and carbon fiber with a filament diameter of 13 μm and an average filament length of 3 mm, 6 mm or 8 mm (S-231, S-232, S-233; all available from Donac, Ltd.) were admixed in the proportions indicated in Table 1, and using the resulting mortars as the matrix, wave absorber testpieces were fabricated.

TABLE 1

| Average filament length | 3 mm | | | | | 6 mm | | | | | 8 mm | | | | |
|---|---|---|---|---|---|---|---|---|---|---|---|---|---|---|---|
| Carbon fiber content (weight %) | 1.0 | 2.0 | 3.0 | 4.0 | 5.0 | 1.0 | 2.0 | 3.0 | 4.0 | 5.0 | 1.0 | 2.0 | 3.0 | 4.0 | 5.0 |
| Orthodox portland cement (g) | 2000 | 2000 | 2000 | 2000 | 2000 | 2000 | 2000 | 2000 | 2000 | 2000 | 2000 | 2000 | 2000 | 2000 | 2000 |
| Silica sand No. 6 (g) | 1000 | 1000 | 1000 | 1000 | 1000 | 1000 | 1000 | 1000 | 1000 | 1000 | 1000 | 1000 | 1000 | 1000 | 1000 |
| Methylcellulose (g) | 15 | 15 | 15 | 15 | 15 | 15 | 15 | 15 | 15 | 15 | 15 | 15 | 15 | 15 | 15 |
| Water (g) | 800 | 800 | 900 | 1000 | 1100 | 800 | 900 | 1000 | 1100 | 1250 | 800 | 900 | 1000 | 1150 | 1300 |
| Carbon fiber (g) | 30 | 60 | 90 | 120 | 150 | 30 | 60 | 90 | 120 | 150 | 30 | 60 | 90 | 120 | 150 |

The specific procedure was as follows. First, orthodox portland cement, methylcellulose and carbon fiber were premixed in a 5-liter Omni-Mixer for 60 seconds. Then, water was added and the mixture was further mixed for 120 seconds. Thereafter, silica sand No. 6 was added and the whole mixture was mixed for 60 seconds to prepare a mortar loaded with carbon fiber.

This mortar was placed in a frame, 40 mm×40 mm×160 mm, with the longitudinal axis of carbon filaments being manually aligned with the longitudinal axis of the frame, and cured in a constant-temperature, constant-humidity atmosphere at 20° C. and 80% R.H. for one day. The cured product was then taken out and cured in a constant-temperature water bath at 20° C. After it was taken out from water bath, the product was further cured in a constant-temperature, constant-humidity atmosphere of 20° C. and 60% R.H. for one day.

Figure 1:
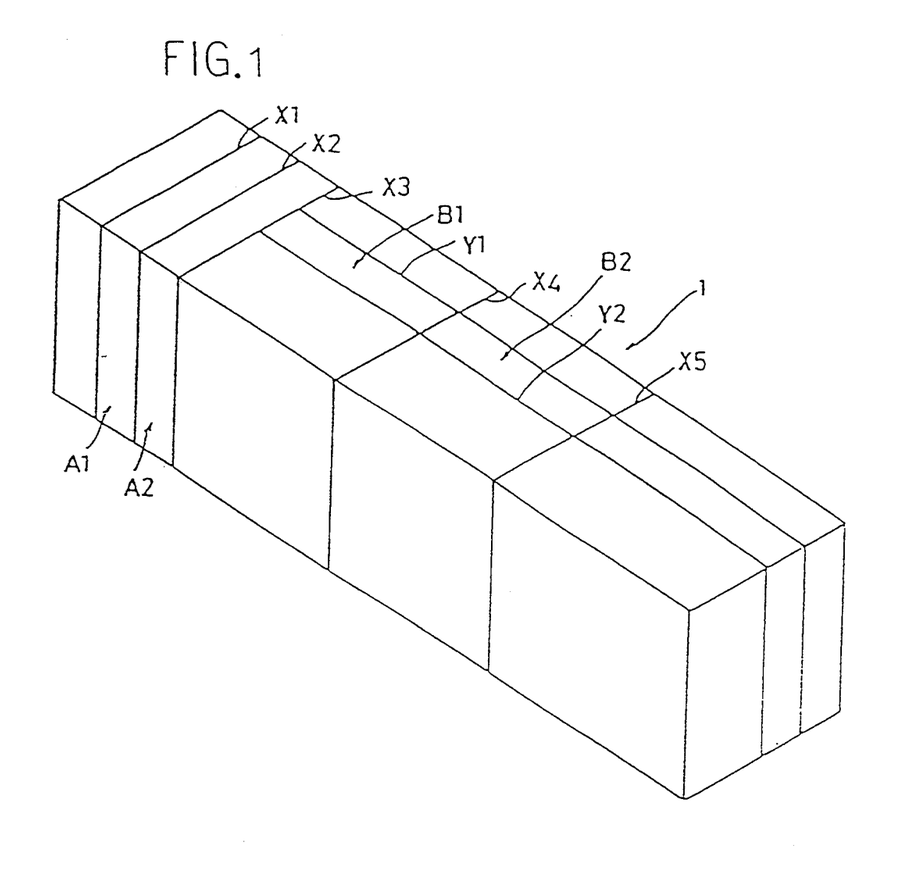
FIG. 1 is a perspective view showing a cured block for obtaining testpieces of the wave absorber to be used in the wave-absorbing method of the invention.
Figure 2:
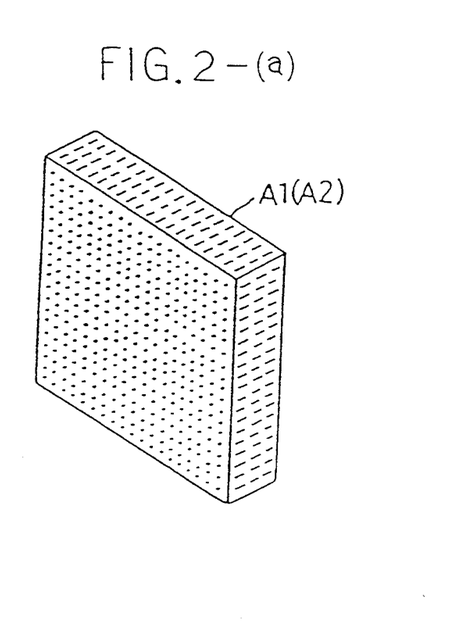
FIG. 2(a) is a perspective view of the longitudinal type testpiece and FIG. 2(b) is a perspective view of the transverse type testpiece.
Figure 2B:
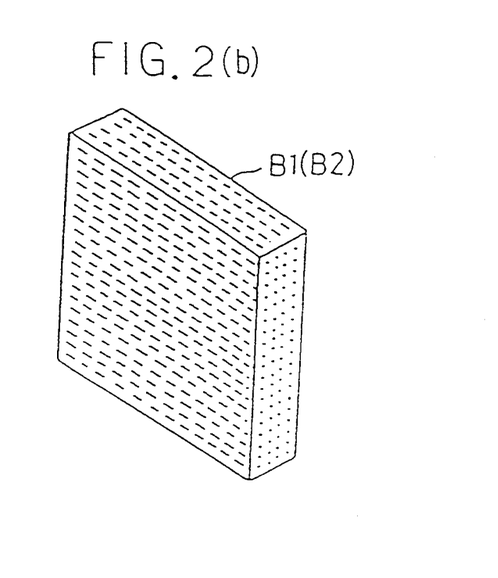

The resulting cured product 1 was cut, as shown in the perspective view of FIG. 1, laterally along cutting lines X1, X2, X3, X4 and X5 and longitudiually along lines Y1 and Y2. Then, blocks each measuring about 40 mm×40 mm×10 mm and located towards the center of the cured product were taken out. Thus were obtained longitudinal type testpieces A1 and A2 in which the longitudinal axis of carbon fiber coincided with the thickness direction of the block as shown in the perspective view of FIG. 2(a) and transverse type testpieces B1 and B2 in which the longitudinal direction of orientation of carbon fiber was perpendicular to the thickness direction of the block as shown in the perspective view of FIG. 2(b).

Each of these testpieces A1, A2, B1 and B2 was rough-filed with a A60 paper file to a thickness of 10 mm and finished with a A200 paper file so that opposite sides would be parallel.

On the day before determination of electrostatic capacitance Cp and conductance G, the testpieces were dried in a dryer at 100° C. for 7 hours, after which they were cooled in vacuo in a desiccator down to room temperature. The testpieces were then placed in polyethylene bags each having a snap closure means and containing a desiccant (silica gel) on a lot-by-lot basis so as to prevent absorption of moisture.

Figure 5:
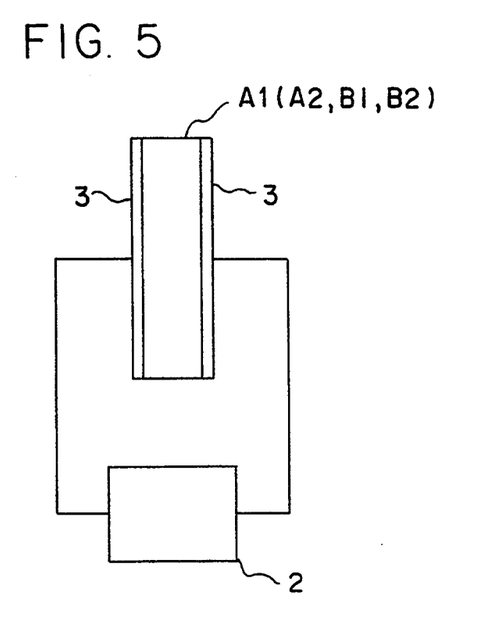
FIG. 5 is a schematic diagram showing the measuring device.

Then, each of the testpieces A1, A2, B1 and B2 was set in position between copper electrode plates 3,3 of an impedance analyzer (4191A: Yokogawa-Hewlett-Packard), which is schematically illustrated in FIG. 5, and an electric field was applied in the thickness direction of the testpiece to measure the electrostatic capacitance (Cp) and conductance (G). Using these values of Cp and G, the values of the real part $\epsilon'$ and imaginary part $\epsilon''$ of the complex relative dielectric constant were calculated.

Thus, the following relation holds between electrostatic capacitance Cp and real part value $\epsilon'$.

$$Cp = \epsilon_0 \cdot \epsilon' \cdot S/d$$

$$\epsilon' = Cp \cdot d/(\epsilon_0 \cdot S)$$

where $\epsilon_0$ means the dielectric constant in vacuo, which is $8.854 \times 10^{-12}$ ($A^2 \cdot S^2 \cdot N^{-1} \cdot m^{-2}$); S means the area ($m^2$) of the testpiece; d is the thickness (m) of the testpiece. Thus, by measuring the electrostatic capacitance Cp, the value of the real part $\epsilon'$ can be calculated.

On the other hand, between conductance G and imaginary part $\epsilon 2''$ the following relation holds.

$$G = \sigma \cdot S/d$$
$$\sigma = G \cdot d/S$$

$$\epsilon'' = \sigma/(\epsilon_0 \cdot \omega)$$
$$= \sigma/(\epsilon_0 \cdot 2\pi f)$$
$$= G \cdot d/(S \cdot \epsilon_0 \cdot 2\pi f)$$

wherein $\sigma$ stands for conductivity, $\epsilon_0$ means the dielectric constant in vacuo, which is equal to $8.854 \times 10^{-12}$ ($A^2 \cdot S^2 \cdot N^{-1} \cdot m^{-2}$); S is the area ($m^2$) of the testpiece; d is the thickness (m) of the testpiece, f is the known frequency of the wave to be absorbed. Thus, by measuring the conductance G, the value of imaginary part $\epsilon''$ can be calculated.

Thus, with the frequency of the wave being fixed at 100 MHz, the real part $\epsilon'$ and imaginary part $\epsilon''$ values of complex relative dielectric constant were determined for each of the longitudinal type testpieces A1 and A2 and the transverse type testpieces B1 and B2 of the compositions containing chopped carbon fiber with an average filament length of 3 mm in proportions of 1 weight %, 2 weight %, 3 weight %, 4 weight % and 5 weight %, respectively, all based on the weight of mortar, as shown in the table presented hereinbefore, and the corresponding carbon fiber-free composition. The results are shown in Table 2 and graphically in FIG. 6. Because of the shearing of filaments occurring at the mixing stage, the average filament length of the carbon fiber in each testpiece was in the range of about 0.2 to about 0.8 mm. The higher the carbon fiber content, the shorter is the carbon fiber thus shorn. It is assumed that the higher the carbon fiber content, the higher is the viscosity of the composition and the more susceptible is the fiber to shearing forces.

TABLE 2

| Carbon fiber content | Longitudinal type testpieces A1 and A2 | | Transverse type testpieces B1 and B2 | |
|---|---|---|---|---|
| | $\epsilon'$ | $\epsilon''$ | $\epsilon'$ | $\epsilon''$ |
| 0 weight % | 4.62 | 0.21 | 4.61 | 0.19 |
| 1 weight % | 42.53 | 1.03 | 23.11 | 1.29 |
| 2 weight % | 61.50 | 6.12 | 34.83 | 3.00 |
| 3 weight % | 81.32 | 15.49 | 49.96 | 5.61 |
| 4 weight % | 103.88 | 20.92 | 88.59 | 13.02 |
| 5 weight % | 72.88 | 14.32 | 63.39 | 16.21 |

The real part $\epsilon'$ and imaginary part $\epsilon''$ values of complex relative dielectric constant were similarly determined for the testpieces prepared using chopped carbon fiber with an average filament length of 6 mm. The results are shown in Table 3 and graphically in FIG. 7. The average filament length of carbon fiber in the testpieces was about 0.6 to about 1.0 mm.

TABLE 3

| Carbon fiber content | Longitudinal type testpieces A1 and A2 | | Transverse type testpieces B1 and B2 | |
|---|---|---|---|---|
| | $\epsilon'$ | $\epsilon''$ | $\epsilon'$ | $\epsilon''$ |
| 0 weight % | 4.62 | 0.21 | 4.61 | 0.19 |
| 1 weight % | 73.22 | 2.06 | 37.78 | 2.64 |
| 2 weight % | 99.09 | 8.33 | 66.65 | 6.20 |
| 3 weight % | 80.28 | 18.35 | 76.62 | 5.81 |
| 4 weight % | 98.39 | 18.43 | 87.20 | 12.29 |
| 5 weight % | 74.42 | 13.60 | 65.16 | 7.13 |

Figure 8:
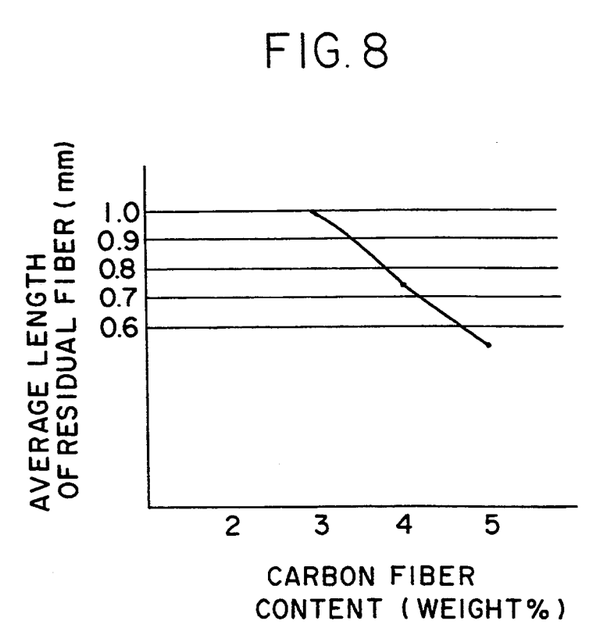
FIG. 8 is a graph showing the relation between the average filament length of residual carbon fiber and the carbon fiber content in the wave absorber prepared using chopped carbon fiber with an average filament length of 6 mm.

The relationship between the average filament length (mm) of residual fiber in the mortar-based composition prepared using chopped carbon fiber with an initial average filament length of 6 mm and the carbon fiber content (weight %) was investigated. The results are shown graphically in FIG. 8.

The carbon fiber content, here, is the weight ratio of carbon fiber to the cement used. When aggregates etc. are contained, the carbon fiber content is approximately halved.

It is seen that the average filament length of residual fiber was decreased as the carbon fiber content was increased. This was because the higher the carbon fiber content, the higher is the viscosity of the composition and the greater is the shearing force acting on the carbon fiber.

Then, a composition prepared by incorporating a carbon fiber having an average filament length of 3 mm (about 0.9 mm in the specimens mentioned below) in a proportion of 2 weight % relative to mortar was extruded from a single-screw vacuum extruding machine and longitudinal type testpieces in which the longitudinal axis of carbon fiber was aligned with the thickness direction of each testpiece and transverse type testpieces in which the longitudinal axis of carbon fiber was perpendicular to the thickness direction were prepared.

Figure 9:
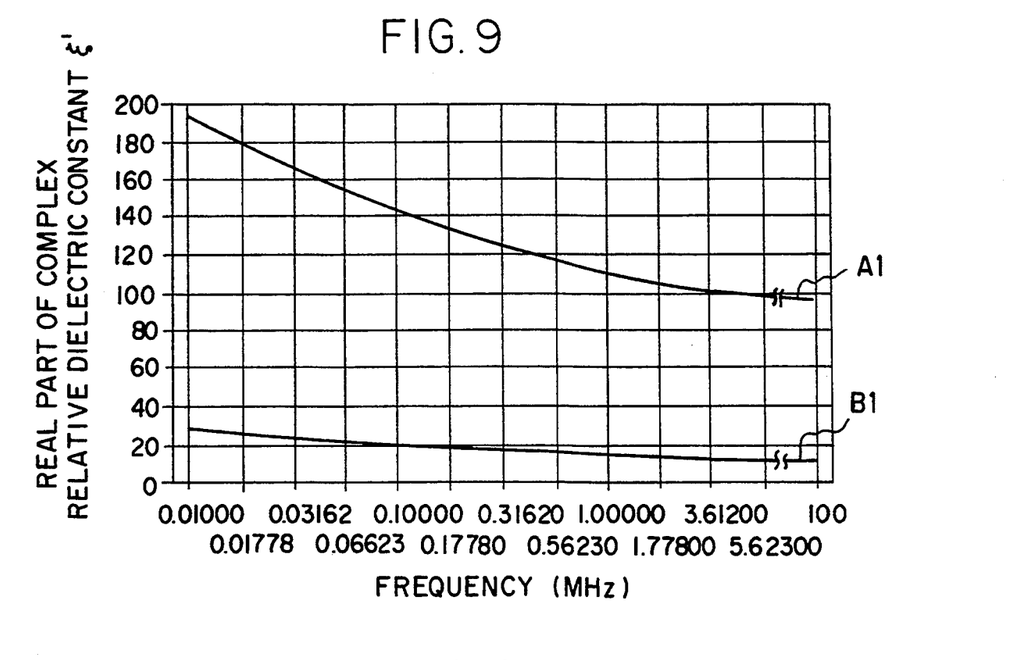
FIG. 9 is a graph showing the relation between frequency and the real part of relative dielectric constant.
Figure 10:
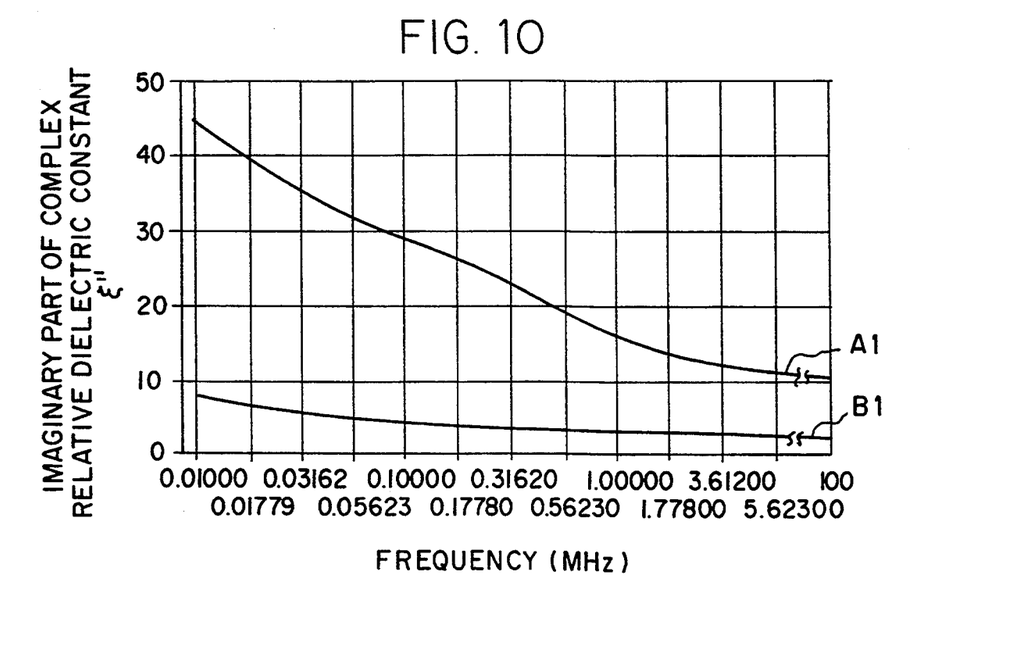
FIG. 10 is a graph showing the relation between frequency and the imaginary part of relative dielectric constant.

For each testpiece, the relations of the frequency of the wave with the real part $\epsilon'$ and imaginary part $\epsilon''$ values of complex relative dielectric constant were determined. The results are graphically shown in FIGS. 9 and 10.

The above results lead to the following conclusions.

(1) The real part $\epsilon'$ of complex relative dielectric constant can be increased to a larger value in the longitudinal type testpieces A1 and A2 in which the longitudinal axis of carbon fiber is aligned with the thickness direction of each testpiece than in the transverse type testpieces B1 and B2 in which the longitudinal axis of carbon fiber is perpendicular to the thickness direction.

Figure 6:
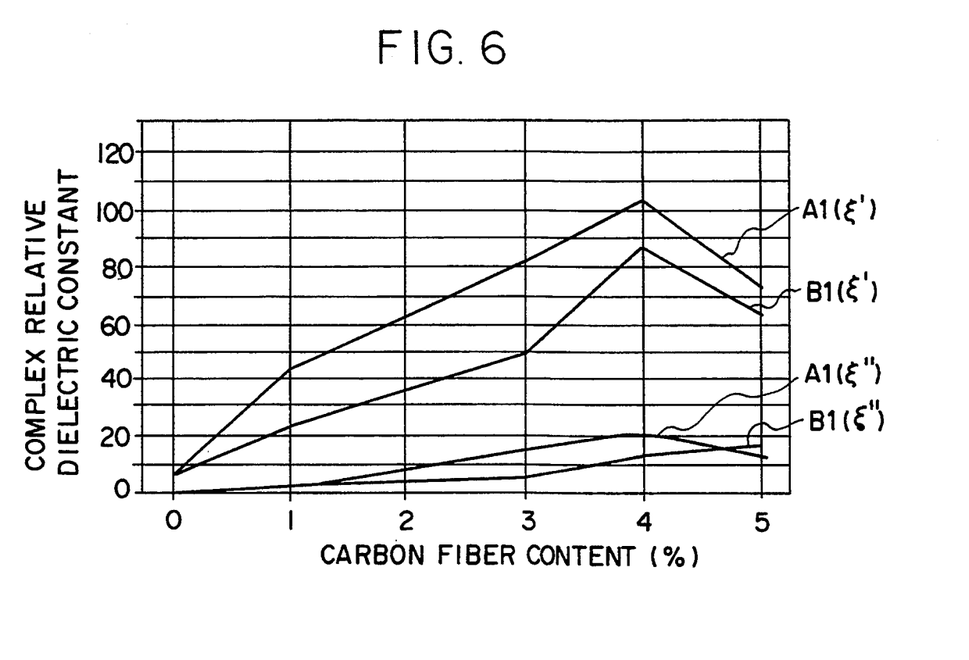
FIG. 6 is a graph showing the relation between carbon fiber content and relative dielectric constant.
Figure 7:
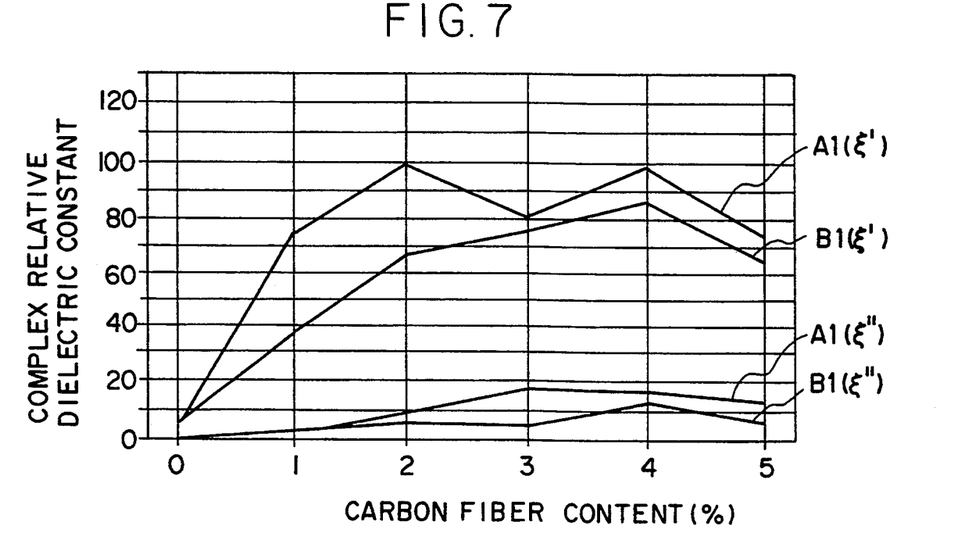
FIG. 7 is a graph showing the relation between carbon fiber content and relative dielectric constant.

(2) As apparent from FIGS. 6 and 7, whereas the real part $\epsilon'$ of complex relative dielectric constant can be large only at a carbon fiber content of 4 weight % when the filament length of the carbon fiber is 3 mm, the real part $\epsilon'$ is sufficiently large even at a low carbon fiber content of 2 weight % when the filament length is 6 mm, thus indicating that when the length of carbon fiber incorporated is long, electromagnetic waves can be efficiently absorbed even if the carbon fiber content is low.

(3) When a vacuum extruding machine is employed, the carbon fiber can be more properly oriented in a given direction (extruding direction) than can be done manually, so that the use of such a machine contributes to workability.

Figure 11:
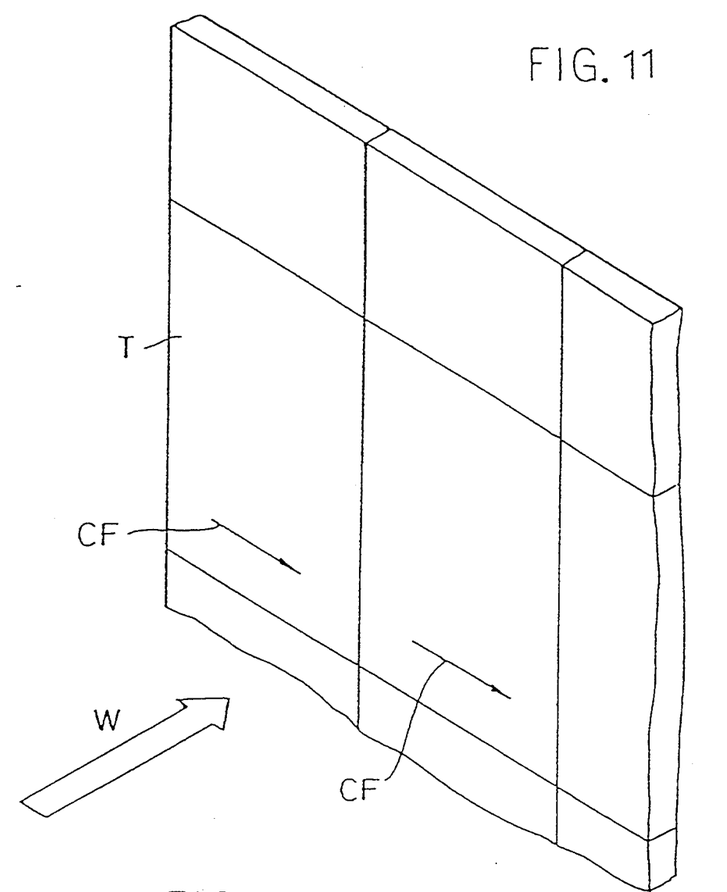
FIG. 11 is a schematic perspective view showing the mode of application to a building.

Thus, when a horizontally polarized wave is to be absorbed, for instance, the ghost can be prevented by constructing the exterior wall T of a structure which lies on the side of incidence of the wave W with a mortar composition prepared as described hereinbefore or a concrete composition prepared by adding a coarse aggregate to the mortar, with the orientation (indicated by CF) of carbon fiber being aligned in a horizontal direction along the wall surface as shown perspectively in FIG. 11.

Figure 12:
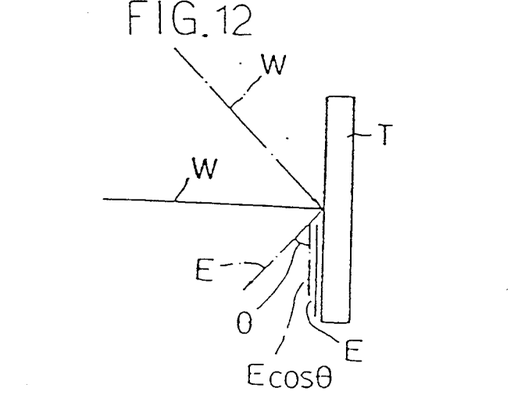
FIG. 12 is a view for explaining the generation of an electric field.

The foregoing is now described in further detail. As shown by the explanatory diagram of FIG. 12, the absorption of the electromagnetic wave W takes place as a voltage is induced in the carbon fiber by the electric field E generated by the incident wave W. Assuming that the angle of incidence of electromagnetic wave W is $\Theta$ with respect to the exterior wall T of the structure, the elective component of the electric field is given by $E\cos\Theta$ but the absorption of the corresponding portion of wave W produces much effect in the prevention of ghosts.

When the vertically polarized wave is to be absorbed, the exterior wall T of the structure is advantageously constructed in such a manner that the orientation of carbon fiber coincide with the vertical direction along the wall surface.

Second Embodiment

Figure 13:
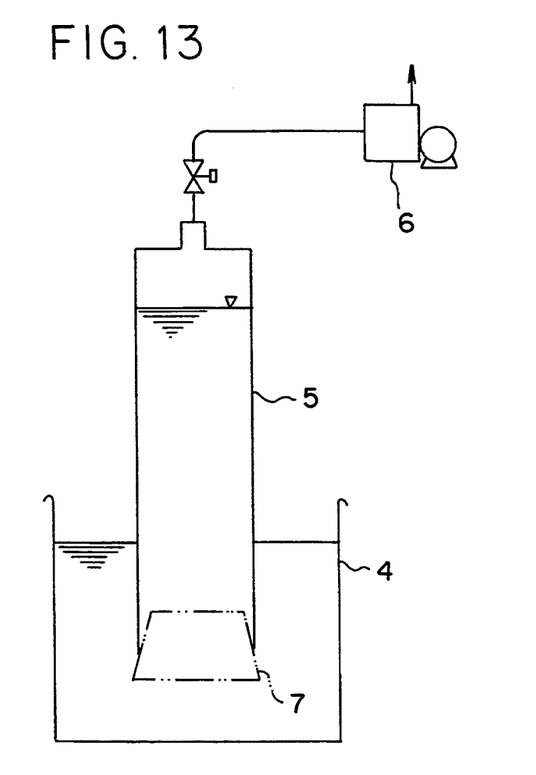
FIG. 13 is a schematic view showing the equipment for use in the manufacture of a wave absorber using a resin matrix.

A carbon fiber having a filament diameter of 13 $\mu$m and an average filament length of 0.70 mm (S-244, Donac, Ltd.) was dried and the dried fiber was dipped and stirred in a mixing tank 4 containing a liquid epoxy resin (Epicoat 827, Yuka-Shell Ltd.) as the main component as schematically shown in FIG. 13.

Then, after suction degassing, the carbon fiber-loaded epoxy resin was cooled and a hardener (Hardener H4510, ACR, Inc) was added in a proportion of 50 weight % based on the main component. Then, using a cylindrical frame 5 having a diameter of 40 mm and a height of 300 mm, the resin was aspirated with a vacuum pump 6. After completion of aspiration, the bottom opening of the cylindrical frame 5 was plugged with a rubber stopper 7. The frame 5 was then taken out and immersed in a water tank for 24 hours. After cooling to room temperature, the cured product was released from the frame.

Then, the molding was dried in a dryer at 80° C. and cut into testpieces each having a thickness of 10 mm and a diameter of 40 mm. In this manner, longitudinal type testpieces A3 in which the longitudinal axis of carbon fiber was aligned with the thickness direction and transverse type testpieces B3 in which the longitudinal axis of carbon fiber was perpendicular to the thickness direction were obtained. The fact that the length of carbon fiber in these testpieces remained almost unchanged from the value before fiber incorporation because of no shearing due to mixing was confirmed by melting each testpiece in a solvent and measuring the length of filaments.

Figure 14:
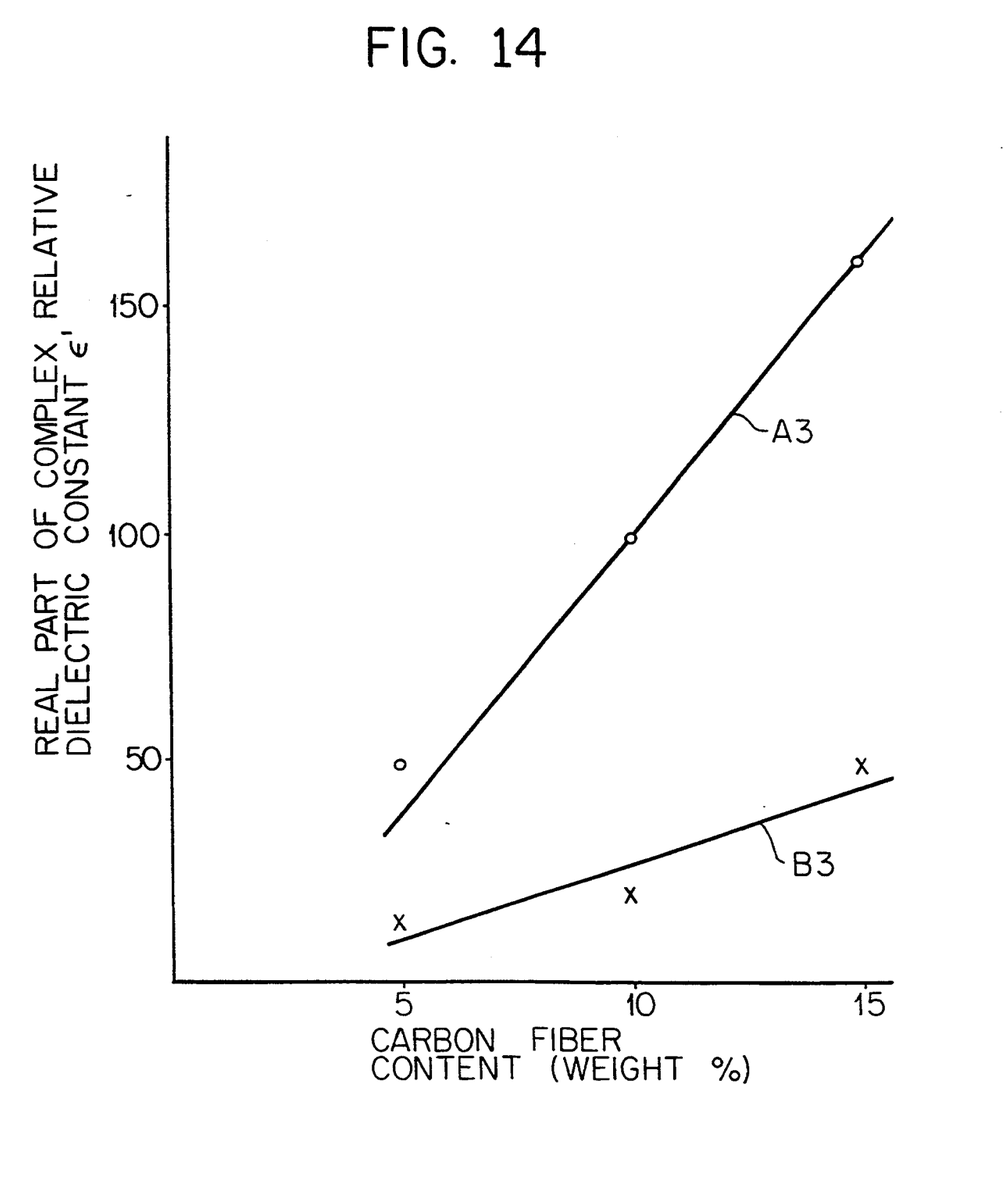
FIG. 14 is a graph showing the relation between carbon fiber content and relative dielectric constant.

As in First Embodiment described hereinbefore, each of the testpieces A3 and B3 containing carbon fiber in proportions of 5, 10 and 15 weight %, all based on the total weight of the main component, hardener and carbon fiber, was set in position between the copper electrode plates 3,3 of the impedance analyzer (4191A, Yokogawa-Hewlett-Packard, Ltd.) 2 (see FIG. 5) and the electrostatic capacitance Cp and conductance G values were measured. Then, using the measured values of Cp and G, the value of real part $\epsilon'$ of complex permittivity (relative dielectric constant) was calculated. The results are graphically shown in FIG. 14.

It is, thus, clear that compared with the transverse type testpiece B3, the real part $\epsilon'$ of A3 can be increased to a very high value and that this value can be increased in proportion to carbon fiber content.

Third Embodiment

Figure 15:
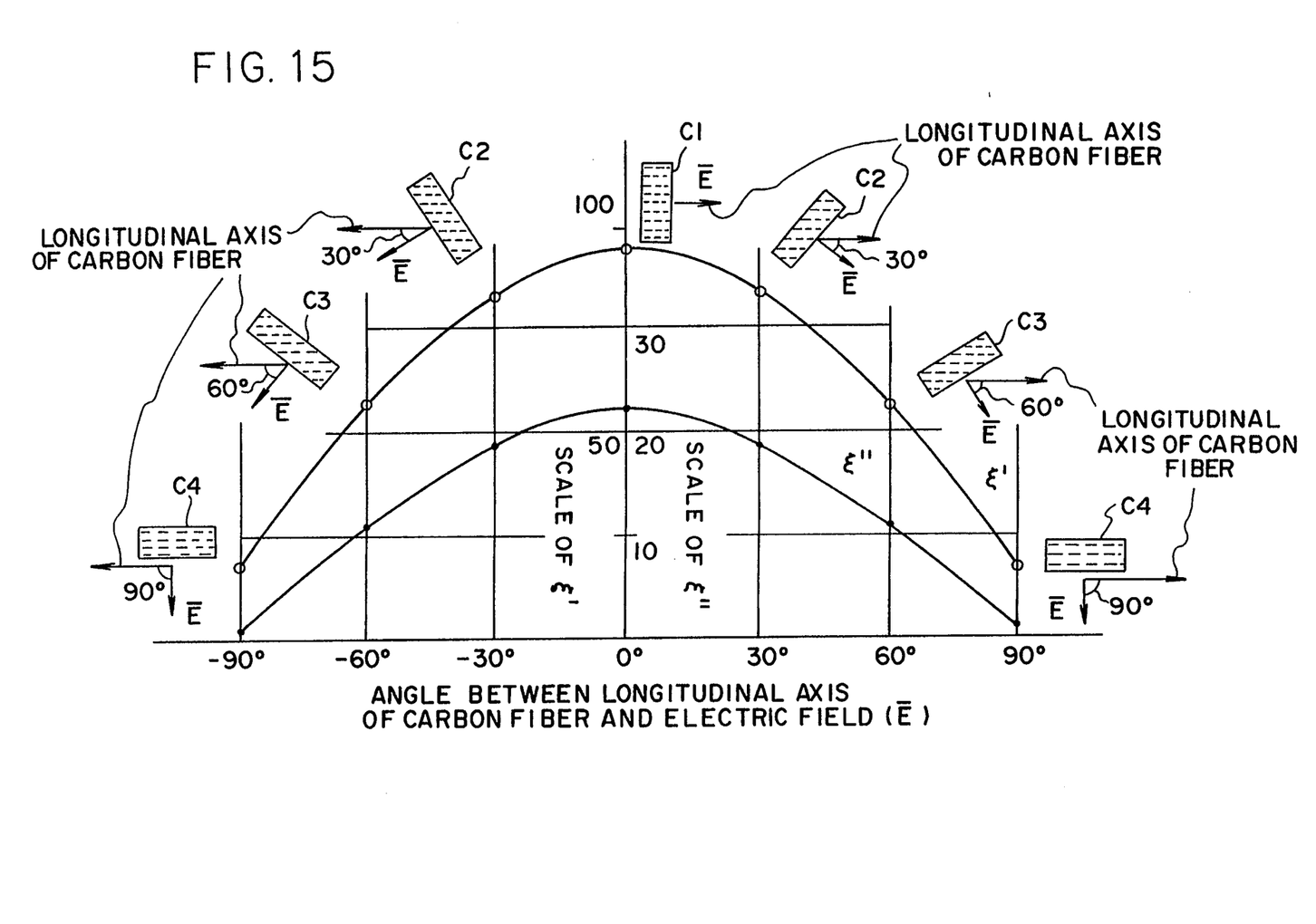
FIG. 15 is a graph showing the relation between the orientation of carbon fiber and the angle of electric field.

A carbon fiber having a filament diameter of 13 $\mu$m and an average filament length of 0.60 mm was dried and the dried carbon fiber was treated as in Second Embodiment described hereinbefore to give a carbon fiber-containing composition based on epoxy resin (Epicoat 827, Yuka-Shell Co., Ltd.) matrix. The composition was cut with the carbon fiber being oriented to prepare testpieces as shown in FIG. 15: a testpiece C1 in which the longitudinal axis of carbon fiber is aligned with the thickness direction, a testpiece C2 in which the longitudinal axis of carbon fiber is aligned at an angle of 30° with the thickness direction, a testpiece C3 in which the longitudinal axis of carbon fiber is aligned at an angle of 60° with the thickness direction, and a testpiece C4 in which the longitudinal axis of carbon fiber is perpendicular to the thickness direction. The fact that the length of carbon fiber in each testpiece remained substantially unchanged from the value before incorporation because of the absence of mixing was confirmed by melting the testpiece in a solvent and measuring the length of filaments.

With the carbon fiber content relative to the total weight of the main component, hardener and carbon fiber being fixed at 10 weight %, each of testpieces C1, C2, C3 and C4 was set in position between the copper electrode plates 3,3 of the impedance analyzer (4191A, Yokogawa-Hewlett-Packard, Ltd.) 2 and the electrostatic capacitance Cp and conductance G were measured at a measuring frequency of 92.75 MHZ with the direction of the electric field relative to the longitudinal axis of carbon fiber being set at 0°, ±30°, ±60° and ±90° (as indicated as vectors in FIG. 15) as otherwise described in First Embodiment. Using these measured values of Cp and G, the values of real part $\epsilon'$ and imaginary part $\epsilon''$ were calculated. The results are shown in Table 4 and graphically in FIG. 15.

TABLE 4

| Angle between the axis of fiber and the direction of electric field | Complex relative dielectiric constant | |
|---|---|---|
| | $\epsilon'$ (real part) | $\epsilon''$ (imaginary part) |
| 0° | 95 | 22 |
| ±30° | 83 | 18.8 |
| ±60° | 56 | 10.5 |
| ±90° | 17 | 1 |

It is apparent that the smaller the angle between the longitudinal axis of carbon fiber and the direction of the electric field of the wave to be absorbed, the higher are the real part $\epsilon'$ and imaginary part $\epsilon''$ values of complex relative dielectric constant that can be attained.

The wave absorber manufactured using a resin matrix as above can be put to use by affixing it to the exterior surface of a structure, such as a transmission tower, bridge, rapid transit railroad facility, speedway structure, golf practice range facility, etc., or an aircraft with its carbon fiber being oriented in the same direction as the electric field generated by the electromagnetic wave to be absorbed.

In whichever of First and Second Embodiments described hereinbefore, a high value can be obtained for the real part of complex relative dielectric constant with the frequency being fixed to 100 MHz in the measurement of complex relative dielectric constant.

The wave absorber is generally designed to absorb electromagnetic waves of a given frequency. Even then, not only electromagnetic waves of the design frequency but also those in the neighborhood of such frequency can also be absorbed. Particularly when the impedance matching of the real part $\epsilon'$ and imaginary part $\epsilon''$ values is satisfactory, electromagnetic waves over a broader frequency range can be effectively absorbed.

Figure 16:
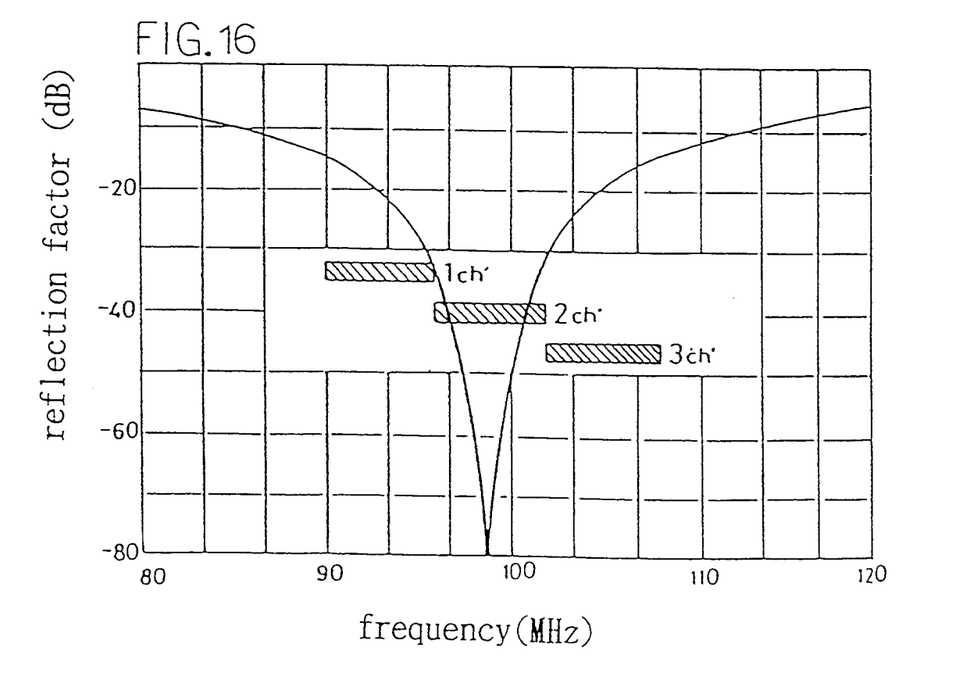
FIG. 16 is a graph showing the relation between frequency and reflection factor.

For example, when the wave absorber is designed to absorb the waves of TV Channel 2 in Japan, as seen from FIG. 16 showing the relation between the frequency and reflection factor, the reflection factor is about −14 dB for the waves of TV Channels 1 and 3 which are close in frequency to the waves of Channel 2, indicating that these waves can also be efficiently absorbed. Moreover, since the frequencies of the waves of TV Channels 4 to 12 are concentrated around 200 MHz, those waves of Channels 4 to 12 can be efficiently absorbed by designing the wave absorber so as to absorb waves of 200 MHz.

In each of First and Second Embodiments described above, it is preferable to obtain the real part value $\epsilon'$ of complex relative dielectric constant necessary for absorbing the wave of the frequency with a minimum possible carbon fiber content relative to the average filament length of the carbon fiber.

EFFECTS OF THE INVENTION

It will be apparent from the above description that in accordance with the wave-absorbing method of the invention, the disposition of the wave absorber is determined according to the direction of the electric field generated by the wave to be absorbed in such a manner that the orientation of its carbon fiber is lined up with the direction of the electric field, irrespective of whether the wave is a horizontally polarized wave or a vertically polarized wave. Accordingly, the wave can be efficiently absorbed by carbon fiber and attenuated even if the carbon fiber content or the absolute amount of carbon fiber is small. With a wave absorber of low carbon content and reduced thickness and weight, the electromagnetic wave can be absorbed with high efficiency. Therefore, ghosts can be prevented with good workability and at low cost by constructing the exterior wall of a skyscraper, the sound-barrier walls of rapid transit railroad and speedway, etc. with the wave absorber or by affixing the wave absorber to the exterior wall of a structure, such as a skyscraper, transmission tower, steel tower, bridge, rapid transit railroad, speedway, golf practice range facility, etc., or an aircraft.

We claim:

1. A method of absorbing electromagnetic waves by absorbing the waves with an oriented carbon fiber-containing composition with the longitudinal axis of its carbon fibers being aligned with the direction of the electric field of the waves to be absorbed, wherein said carbon fiber-containing composition has a degree of carbon fiber orientation A defined as $\epsilon'\text{max} - \epsilon'\text{min}$ and a degree of carbon fiber orientation B defined as $\epsilon''\text{max} - \epsilon''\text{min}$, the degree of carbon fiber orientation A being not less than 25 and/or the degree of carbon fiber orientation B being not less than 5, wherein $\epsilon'$ and $\epsilon''$ are the real part and imaginary part, respectively, of the complex relative dielectric constant to dielectric constant in vacuo of said carbon fiber-containing composition when the waves to be absorbed are incident on the composition in an optional direction and $\epsilon'$max, $\epsilon'$min and $\epsilon''$max and $\epsilon''$min are the maximum and minimum values thereof.

2. A method of absorbing electromagnetic waves according to claim 1, wherein a matrix component of said carbon fiber-containing composition is an exterior wall made of mortar or concrete and said carbon fiber is contained in a proportion of 0.5 to 10 weight %.

3. A method of absorbing electromagnetic waves according to claim 1, wherein a matrix component of said carbon fiber-containing composition is a resin and said carbon fiber is contained in a proportion of 5 to 25 weight %.

* * * * *